(12) United States Patent
Liu et al.

(10) Patent No.: US 11,442,583 B2
(45) Date of Patent: Sep. 13, 2022

(54) FINGERPRINT IDENTIFICATION MODULE, MANUFACTURING METHOD THEREOF AND ELECTRONIC DEVICE

(71) Applicant: BOE TECHNOLOGY GROUP CO., LTD., Beijing (CN)

(72) Inventors: Wenqu Liu, Beijing (CN); Xiufeng Li, Beijing (CN); Qi Yao, Beijing (CN); Feng Zhang, Beijing (CN); Liwen Dong, Beijing (CN); Zhao Cui, Beijing (CN); Chuanxiang Xu, Beijing (CN); Detian Meng, Beijing (CN); Xiaoxin Song, Beijing (CN); Libo Wang, Beijing (CN); Yang Yue, Beijing (CN); Dongfei Hou, Beijing (CN); Zhijun Lv, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 112 days.

(21) Appl. No.: 16/966,394

(22) PCT Filed: Jan. 17, 2020

(86) PCT No.: PCT/CN2020/072849
§ 371 (c)(1),
(2) Date: Jul. 30, 2020

(87) PCT Pub. No.: WO2020/156257
PCT Pub. Date: Aug. 6, 2020

(65) Prior Publication Data
US 2021/0200985 A1    Jul. 1, 2021

(30) Foreign Application Priority Data

Jan. 28, 2019  (CN) .......................... 201910082585.9
Sep. 12, 2019  (WO) ................ PCT/CN2019/105749

(51) Int. Cl.
*G06F 3/043* (2006.01)
*H01L 41/04* (2006.01)
(Continued)

(52) U.S. Cl.
CPC .......... *G06F 3/0436* (2013.01); *G06F 3/0433* (2013.01); *G06F 3/0445* (2019.05);
(Continued)

(58) Field of Classification Search
CPC .. G06F 3/0436; G06F 3/04164; G06F 3/0433; G06F 3/0445; G06F 2203/04103;
(Continued)

(56) References Cited

U.S. PATENT DOCUMENTS 10,452,887 B2   10/2019   Salvia et al.
10,691,911 B2    6/2020   Han et al.
(Continued)

FOREIGN PATENT DOCUMENTS

CN   103927468 A   7/2014
CN   106250834 A   12/2016
(Continued)

OTHER PUBLICATIONS

USPTO NFOA dated Feb. 7, 2022 in connection with U.S. Appl. No. 16/642,804.
(Continued)

*Primary Examiner* — Jonathan A Boyd

(57) ABSTRACT

A fingerprint identification module, a manufacturing method thereof and an electronic device are disclosed. In the fingerprint identification module, an auxiliary structure is at least partially located on a functional substrate, and a plurality of first driving electrodes are on a side, away from the functional substrate, of the piezoelectric material and the auxiliary structure; each first driving electrode extends along a first direction and exceeds a first edge of the piezoelectric
(Continued)

material layer in the first direction; the plurality of first driving electrodes are arranged at intervals along a second direction; the auxiliary structure is at least in contact with the first edge; the auxiliary structure includes a slope portion; and a thickness of the slope portion in a direction perpendicular to the functional substrate gradually decreases in a direction from the first edge to a position away from a center of the piezoelectric material layer.

20 Claims, 7 Drawing Sheets

(51) Int. Cl.
*H01L 41/047* (2006.01)
*H01L 41/083* (2006.01)
*H01L 41/113* (2006.01)
*H01L 41/27* (2013.01)
*G06F 3/044* (2006.01)
*G06F 3/041* (2006.01)
*G06V 40/13* (2022.01)
*G06V 40/12* (2022.01)

(52) U.S. Cl.
CPC ...... *G06F 3/04164* (2019.05); *G06V 40/1306* (2022.01); *G06V 40/1365* (2022.01); *H01L 41/042* (2013.01); *H01L 41/0477* (2013.01); *H01L 41/083* (2013.01); *H01L 41/1132* (2013.01); *H01L 41/27* (2013.01); *G06F 2203/04103* (2013.01)

(58) Field of Classification Search
CPC ........... G06V 40/1306; G06V 40/1365; G06V 10/147; H01L 41/042; H01L 41/0477; H01L 41/083; H01L 41/1132; H01L 41/27
See application file for complete search history.

(56) References Cited

U.S. PATENT DOCUMENTS

| | | | |
|---|---|---|---|
| 2008/0084457 | A1 | 4/2008 | Hibi et al. |
| 2009/0236940 | A1 | 9/2009 | Nakayama et al. |
| 2016/0124560 | A1 | 5/2016 | Watazu et al. |
| 2016/0163958 | A1 | 6/2016 | Park et al. |
| 2016/0364063 | A1 | 12/2016 | Wang et al. |
| 2019/0102045 | A1 | 4/2019 | Miranto et al. |
| 2020/0356744 | A1* | 11/2020 | Wang .................... H01L 41/047 |
| 2021/0019018 | A1 | 1/2021 | Guo et al. |
| 2021/0216734 | A1 | 7/2021 | Liu et al. |
| 2021/0334493 | A1 | 10/2021 | Tang et al. |

FOREIGN PATENT DOCUMENTS

| | | | | |
|---|---|---|---|---|
| CN | 106782085 | A | | 5/2017 |
| CN | 106896955 | A | | 6/2017 |
| CN | 106951130 | A | | 7/2017 |
| CN | 107122080 | A | | 9/2017 |
| CN | 107220630 | A | | 9/2017 |
| CN | 107609539 | A | | 1/2018 |
| CN | 107798300 | A | | 3/2018 |
| CN | 108363993 | A | | 8/2018 |
| CN | 108446685 | A | | 8/2018 |
| CN | 108598117 | A | | 9/2018 |
| CN | 108664913 | A | | 10/2018 |
| CN | 108776797 | A | | 11/2018 |
| CN | 108845323 | A | | 11/2018 |
| CN | 108877516 | A | | 11/2018 |
| CN | 108921074 | A | * 11/2018 | .......... G06K 9/0002 |
| CN | 108921074 | A | | 11/2018 |
| CN | 208126414 | U | | 11/2018 |
| CN | 109145859 | A | | 1/2019 |
| CN | 109219817 | A | | 1/2019 |
| CN | 109829419 | A | | 5/2019 |

OTHER PUBLICATIONS

The First Chinese Office Action dated Aug. 5, 2020; Appln. No. 201910082585.9.

USPTO NOA dated Dec. 24, 2021 in connection with U.S. Appl. No. 16/771,140.

* cited by examiner

300

FINGERPRINT IDENTIFICATION MODULE, MANUFACTURING METHOD THEREOF AND ELECTRONIC DEVICE

This application claims the benefit of Chinese patent application No. 201910082585.9 filed on Jan. 28, 2019 and the benefit of PCT application No. PCT/CN2019/105749 filed on Sep. 12, 2019, which are hereby entirely incorporated by reference as a part of the present application.

TECHNICAL FIELD

The embodiments of the present disclosure relate to a fingerprint identification module, a manufacturing method of the fingerprint identification module and an electronic device.

BACKGROUND

With the continuous development of science and technology, fingerprint identification technology has been gradually applied to people's daily life. Fingerprint identification technology can identify different fingerprints by comparing their detailed feature points, so as to achieve the function of identity recognition. Generally, fingerprint identification technology can be divided into optical fingerprint identification technology, silicon chip fingerprint identification technology and ultrasonic fingerprint identification technology.

At present, the ultrasonic fingerprint identification technology is a hot research direction of major manufacturers. An ultrasonic fingerprint identification structure is mainly a three-layer structure, which includes first driving electrodes, receiving electrodes and a piezoelectric layer between the first driving electrodes and the receiving electrodes. In the case that a driving voltage is applied to the first driving electrodes and the receiving electrodes, the piezoelectric layer is excited by the voltage to generate an inverse piezoelectric effect to send a first ultrasonic wave outward. The first ultrasonic wave contacts a finger and is reflected back by the finger to form second ultrasonic waves. Because the fingerprint includes valleys and ridges, vibration intensities of the second ultrasonic waves reflected by different positions of the fingerprint back to the piezoelectric layer are different. At this time, in the case that a fixed voltage is applied to the first driving electrodes, the piezoelectric layer can convert the second ultrasonic waves into voltage signals, which are transmitted to a fingerprint identification module through the receiving electrodes, and positions of the valleys and ridges in the fingerprint can be judged according to the voltage signals.

SUMMARY

The embodiments of the present disclosure provide a fingerprint identification module. The fingerprint identification module includes a functional substrate, a piezoelectric material layer, an auxiliary structure and a plurality of first driving electrodes; the piezoelectric material layer is on the functional substrate; the auxiliary structure is at least partially located on the functional substrate; the plurality of first driving electrodes are at a side, away from the functional substrate, of the piezoelectric material layer and the auxiliary structure; each first driving electrode extends along a first direction and exceeds a first edge of the piezoelectric material layer in the first direction; the plurality of first driving electrodes are arranged at intervals along a second direction; the auxiliary structure is at least in contact with the first edge; the auxiliary structure includes a slope portion; a thickness of the slope portion in a direction perpendicular to the functional substrate gradually decreases in a direction from the first edge to a position away from a center of the piezoelectric material layer; the second direction intersects with the first direction. In the fingerprint identification module, because the auxiliary structure is in contact with the first edge of the piezoelectric material layer and includes the slope portion, problems such as wire disconnection and conductive material residue can be avoided in the process of forming the plurality of first driving electrodes on the piezoelectric material layer, thereby improving the yield of products.

At least one embodiment of the present disclosure provides a fingerprint identification module which includes: a functional substrate; a piezoelectric material layer on the functional substrate; an auxiliary structure at least partially located on the functional substrate; a plurality of first driving electrodes at a side, away from the functional substrate, of the piezoelectric material layer and the auxiliary structure. Each first driving electrode extends along a first direction and exceeds a first edge of the piezoelectric material layer in the first direction; the plurality of first driving electrodes are arranged at intervals along a second direction; the auxiliary structure is at least in contact with the first edge; the auxiliary structure comprises a slope portion; a thickness of the slope portion in a direction perpendicular to the functional substrate gradually decreases in a direction from the first edge to a position away from a center of the piezoelectric material layer; the second direction intersects with the first direction.

For example, in the fingerprint identification module provided by at least one embodiment of the present disclosure, a slope angle of the slope portion is less than 60 degrees.

For example, in the fingerprint identification module provided by at least one embodiment of the present disclosure, the auxiliary structure includes: a main body portion on the functional substrate and in the same layer as the piezoelectric material layer; and an overlapping portion connected with the main body portion and located at a side, away from the functional substrate, of the first edge of the piezoelectric material layer.

For example, in the fingerprint identification module provided by at least one embodiment of the present disclosure, a size of the overlapping portion in the first direction is larger than 200 microns.

For example, in the fingerprint identification module provided by at least one embodiment of the present disclosure, a material of the auxiliary structure includes a curing adhesive.

For example, in the fingerprint identification module provided by at least one embodiment of the present disclosure, a material of the auxiliary structure includes an optical curing adhesive.

For example, in the fingerprint identification module provided by at least one embodiment of the present disclosure, a material of the piezoelectric material layer includes polyvinylidene fluoride.

For example, in the fingerprint identification module provided by at least one embodiment of the present disclosure, the auxiliary structure is arranged along an edge of the piezoelectric material, and the auxiliary structure is also in contact with a second edge of the piezoelectric material layer in the second direction.

For example, in the fingerprint identification module provided by at least one embodiment of the present disclosure, each of the first driving electrodes includes a metal layer and a transparent metal oxide layer which are sequentially stacked in the direction perpendicular to the functional substrate.

For example, the fingerprint identification module provided by at least one embodiment of the present disclosure further includes: a first insulating layer at a side, away from the functional substrate, of the plurality of first driving electrodes; an acoustic wave reflective layer at a side, away from the plurality of first driving electrodes, of the first insulating layer, wherein an orthographic projection of the acoustic wave reflective layer on the functional substrate is overlapped with an orthographic projection of the piezoelectric material layer on the functional substrate.

For example, in the fingerprint identification module provided by at least one embodiment of the present disclosure, the functional substrate includes: a substrate; a receiving electrode layer which is at a side, close to the substrate, of the piezoelectric material layer and includes a plurality of receiving electrodes; and a driving circuit layer which is at a side, close to the substrate, of the receiving electrode and includes a plurality of driving units, wherein orthographic projections of the plurality of receiving electrodes on the substrate at least partially is overlapped with an orthographic projection of the piezoelectric material layer, and the orthographic projections of the plurality of receiving electrodes on the substrate at least partially is overlapped with orthographic projections of the first driving electrodes.

For example, in the fingerprint identification module provided by at least one embodiment of the present disclosure, the functional substrate further includes: a second insulating layer between the receiving electrode layer and the piezoelectric material layer.

For example, in the fingerprint identification module provided by at least one embodiment of the present disclosure, the functional substrate further includes: a plurality of second driving electrodes between the receiving electrode layer and the driving circuit layer, wherein the plurality of first driving electrodes and the plurality of second driving electrodes constitute a plurality of driving electrode pairs, and an orthographic projection of the first driving electrode and an orthographic projection of the second driving electrode which are in each driving electrode pair on the piezoelectric material layer at least partially overlap with each other.

At least one embodiment of the present disclosure further provides an electronic device, including the fingerprint identification module according to any one of the above embodiments.

At least one embodiment of the present disclosure further provides a manufacturing method of a fingerprint identification module, and the method includes: providing a functional substrate; forming a piezoelectric material layer on the functional substrate; forming an auxiliary structure on the functional substrate on which the piezoelectric material layer is formed; and forming a plurality of first driving electrodes on a side, away from the functional substrate, of the piezoelectric material layer and the auxiliary structure, wherein each first driving electrode extends along a first direction and exceeds a first edge of the piezoelectric material layer in the first direction; the plurality of first driving electrodes are arranged at intervals along a second direction; the auxiliary structure is at least in contact with the first edge; the auxiliary structure includes a slope portion; a thickness of the slope portion gradually decreases from the first edge to a direction away from a center of the piezoelectric material layer, and the thickness of the slope portion in a direction perpendicular to the functional substrate gradually decreases; and the second direction intersects with the first direction.

For example, in the manufacturing method of the fingerprint identification module, the forming the auxiliary structure on the functional substrate on which the piezoelectric material layer is formed includes: coating a liquid curing adhesive on the functional substrate on which the piezoelectric material layer is formed; patterning the liquid curing adhesive to expose at least part of the piezoelectric material layer; curing the liquid curing adhesive, wherein the liquid curing adhesive is leveled and cured to form the slope portion.

For example, in the manufacturing method of the fingerprint identification module, the forming the auxiliary structure on the functional substrate on which the piezoelectric material layer is formed includes: patterning the liquid curing adhesive to expose at least the part of the piezoelectric material layer to form a main body portion which is on the functional substrate and in the same layer as the piezoelectric material layer, and to form an overlapping portion which is connected with the main body portion and located at a side, away from the functional substrate, of the first edge of the piezoelectric material layer.

For example, in the manufacturing method of the fingerprint identification module, a size of the overlapping portion in the first direction is larger than 200 microns.

For example, in the manufacturing method of the fingerprint identification module, the forming the plurality of first driving electrodes on the side, away from the functional substrate, of the piezoelectric material layer and the auxiliary structure includes: forming a metal layer on the side, away from the functional substrate, of the piezoelectric material layer and the auxiliary structure; forming a transparent metal oxide layer on a side, away from the piezoelectric material layer, of the metal layer; patterning the transparent metal oxide layer to form a plurality of strip-shaped transparent metal oxides; and etching the metal layer by using the plurality of strip-shaped transparent metal oxides as a mask to form the plurality of first driving electrodes.

For example, in the manufacturing method of the fingerprint identification module, the forming the piezoelectric material layer on the functional substrate includes: coating and crystallizing a piezoelectric material on the functional substrate; forming a hard mask on the piezoelectric material after crystallization; etching the piezoelectric material after crystallization by using the hard mask as a mask to form the piezoelectric material layer, wherein a material of the hard mask includes at least one selected from the group consisting of molybdenum, aluminum, titanium, niobium and indium tin oxide.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
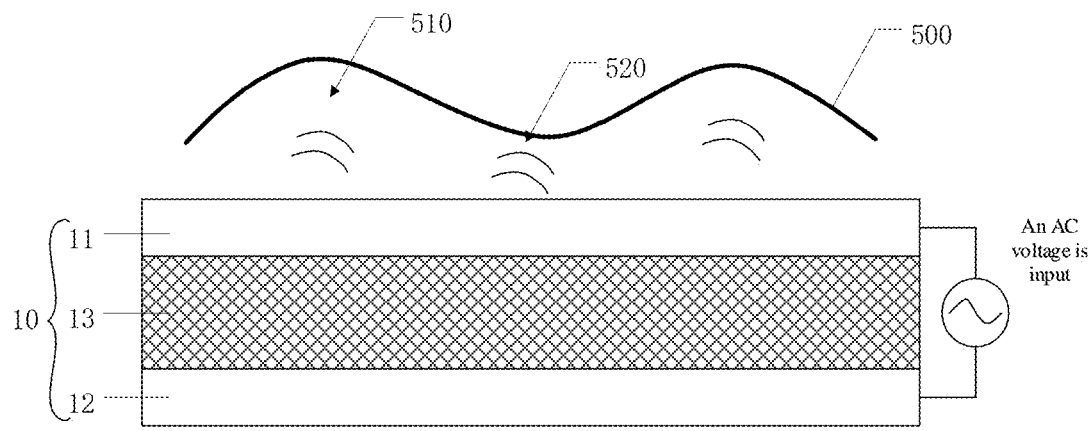
FIG. 1 is a schematic diagram showing that a fingerprint identification module sends an ultrasonic wave.
Figure 2:
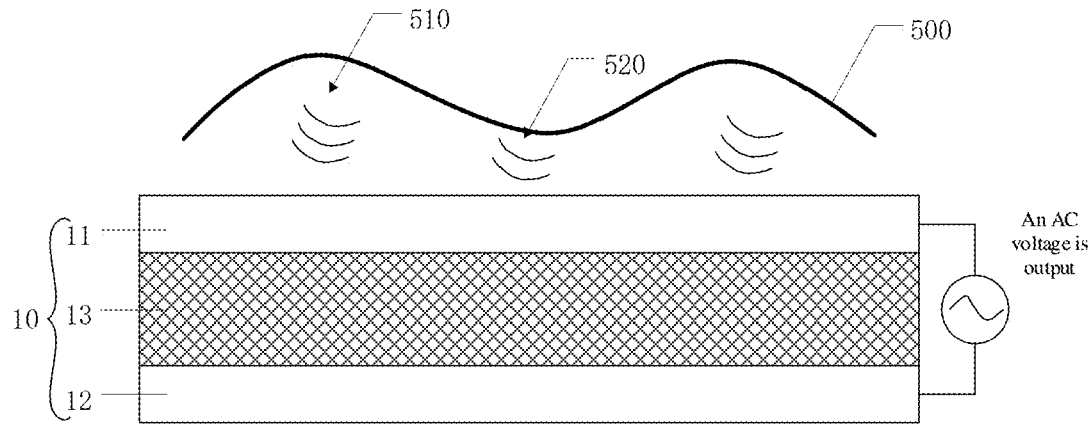
FIG. 2 is a schematic diagram showing that the fingerprint identification module receives an ultrasonic wave.

FIG. 1 is a schematic diagram showing that a fingerprint identification module sending an ultrasonic wave; FIG. 2 is a schematic diagram showing that the fingerprint identification module receives an ultrasonic wave. As shown in FIG. 1, the fingerprint identification module includes an ultrasonic sensor 10; the ultrasonic sensor 10 includes an upper electrode 11, a lower electrode 12 and a piezoelectric layer 13 located between the upper electrode 11 and the lower electrode 12. The piezoelectric layer 13 is made of piezoelectric material and can be excited by a voltage to produce inverse piezoelectric effect. As shown in FIG. 1, in the case that an alternating voltage (AC voltage) is input to the upper electrode 11 and the lower electrode 12 (for example, the upper electrode 11 is grounded and an alternating square wave is applied to the lower electrode 12), the piezoelectric layer 13 deforms due to the inverse piezoelectric effect or drives the films above and below the piezoelectric layer 13 to vibrate together, so that an ultrasonic wave can be generated and emitted outward. It should be noted that in the case that a cavity (e.g., an air cavity) is provided on the side of the upper electrode 11 away from the piezoelectric layer 13 or the side of the lower electrode 12 away from the piezoelectric layer 13, the ultrasonic wave emitted by the ultrasonic sensor is enhanced, so that the ultrasonic wave can be better emitted.

As shown in FIG. 2, the ultrasonic wave emitted by the ultrasonic sensor 10 is reflected by a fingerprint 500, and the reflected ultrasonic wave is converted into an alternating voltage in the piezoelectric layer; at this time, the upper electrode 11 is grounded, and the lower electrode 12 can be used as a receiving electrode to receive the alternating voltage generated by the piezoelectric layer. The fingerprint 500 includes valleys 510 and ridges 520, and the valley 510 and the ridge 520 have different reflection capabilities for the ultrasonic wave (the valley 510 has a stronger reflection capability for the ultrasonic wave), resulting in different intensities of the ultrasonic wave reflected by the valley 510 and the ultrasonic wave reflected by the ridge 520. Therefore, it can be judged from the alternating voltage received by the receiving electrode whether the ultrasonic wave is reflected by the valley or the ridge.

Figure 3:
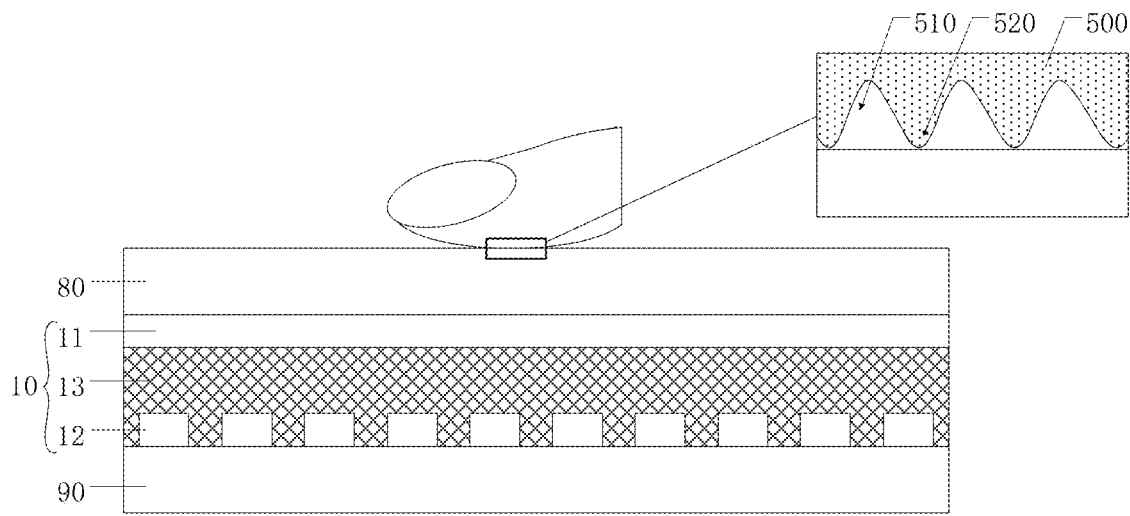
FIG. 3 is a schematic diagram showing that fingerprint recognition is performed by the fingerprint identification module.

FIG. 3 is a schematic diagram showing that fingerprint recognition is performed by the fingerprint identification module. As shown in FIG. 3, the fingerprint identification module includes an upper electrode 11, a plurality of lower electrodes 12, a piezoelectric layer 13 between the upper electrode 11 and the plurality of lower electrodes 12, a substrate 80 on one side of the upper electrode 11 away from the piezoelectric layer 13, and a protective layer 90 on one side of the plurality of lower electrodes 12 away from the piezoelectric layer 13. The ultrasonic sensor 10 formed by the plurality of lower electrodes 12, the piezoelectric layer 13 and the upper electrode 11 can transmit and receive the ultrasonic wave, that is, the ultrasonic sensor 10 serves as both an ultrasonic transmitting sensor and an ultrasonic receiving sensor. In the case that the fingerprint is in contact with the substrate 80, the ultrasonic wave transmitted by the ultrasonic sensor 10 is reflected by the fingerprint 500, and the reflected ultrasonic wave is converted into an alternating voltage in the piezoelectric layer. At this time, the upper electrode 11 is grounded, and the plurality of lower electrodes 12 can be used as receiving electrodes, so that the alternating voltage generated by the piezoelectric layer can be received at different positions. The fingerprint 500 includes valleys 510 and ridges 520, which have different reflection capabilities for the ultrasonic wave (the valleys 510 have stronger reflection capabilities for the ultrasonic wave), resulting in different intensities of ultrasonic waves reflected by the valleys 510 and the ridges 520. Therefore, the position information of the valleys and the ridges in the fingerprint 500 can be obtained by the alternating voltage received by the plurality of lower electrodes 12, so that fingerprint recognition can be realized.

Figure 4:
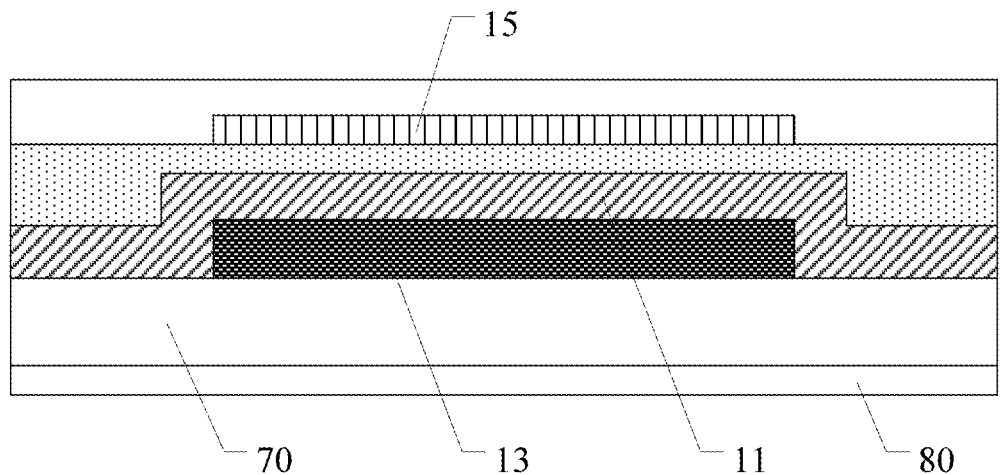
FIG. 4 is a schematic structural diagram of the fingerprint identification module.
Figure 5A:
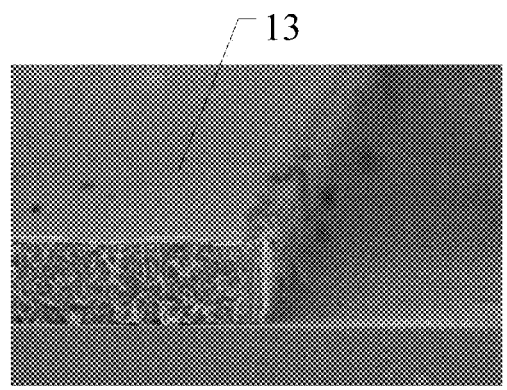
FIG. 5A is a scanning electron microscope image of a piezoelectric layer in the fingerprint identification module.
Figure 5B:
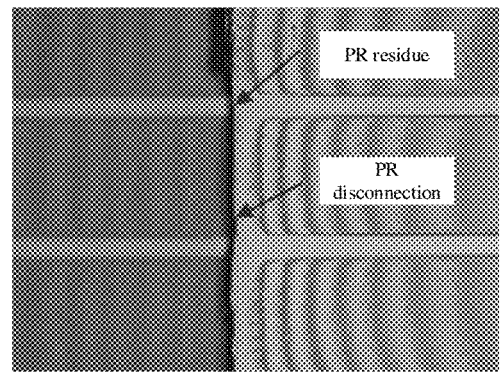
FIG. 5B is a scanning electron microscope image of a photoresist pattern on a conductive layer in the fingerprint identification module.
Figure 5C:
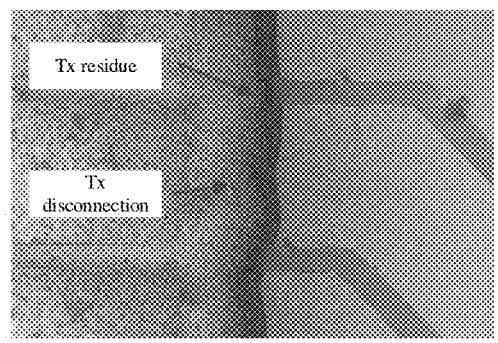
FIG. 5C is a scanning electron microscope image of a plurality of first driving electrodes on the piezoelectric layer in the fingerprint identification module.

FIG. 4 is a schematic structural diagram of the fingerprint identification module. As shown in FIG. 4, the fingerprint identification module includes a substrate 80, a CMOS (Complementary Metal Oxide Semiconductor) backplane 70, a piezoelectric layer 13, a plurality of first driving electrodes 11 and an acoustic wave reflection layer 15. The CMOS backplane 70 may include the receiving electrodes and corresponding driving units. In the research, the inventor(s) of this application noticed that in a manufacturing process of the fingerprint identification module, it is necessary to form a conductive layer on the side of the piezoelectric layer away from the CMOS backplane, then form a photoresist pattern on the side of the conductive layer away from the piezoelectric layer, and finally etch the conductive layer with the photoresist pattern as a mask to form the plurality of first driving electrodes. FIG. 5A is a scanning electron microscope image of the piezoelectric layer in the fingerprint identification module; FIG. 5B is a scanning electron microscope image of the photoresist pattern on the conductive layer in the fingerprint identification module; FIG. 5C is a scanning electron microscope image of the plurality of first driving electrodes on the piezoelectric layer in the fingerprint identification module. As shown in FIGS. 5A and 5B, because a slope of an edge of the piezoelectric layer is large (about 90 degrees), defects such as disconnection (PR (photoresist) disconnection) and photoresist residue (PR residue) are easily generated at the edge of the piezoelectric layer in the process (exposure and development processes) of forming the photoresist pattern. As shown in FIG. 5C, due to the large slope (about 90 degrees) of the edge of the piezoelectric layer and the defects such as the disconnection and the photoresist residue caused by the photoresist pattern, disconnection (Tx disconnection) of a plurality of strip-shaped driving electrodes formed by the conductive layer or residual conductive material formed by the conductive layer (Tx residue) may occur at the edge of the piezoelectric layer in the subsequent etching process, resulting in various defects.

Therefore, the embodiments of the disclosure provide a fingerprint identification module, a manufacturing method of the fingerprint identification module and an electronic device. The fingerprint identification module includes a substrate, a piezoelectric material layer, an auxiliary structure and a plurality of first driving electrodes; the piezoelectric material layer is located on the substrate, the auxiliary structure is at least partially located on the substrate, and the plurality of first driving electrodes are located on one side of the piezoelectric material layer and the auxiliary structure away from the substrate; each first driving electrode extends along a first direction and exceeds a first edge of the piezoelectric material layer in the first direction; the plurality of first driving electrodes are arranged at intervals along a second direction; the auxiliary structure is at least in contact with the first edge; the auxiliary structure includes a slope portion; a thickness of the slope portion in a direction perpendicular to the functional substrate gradually decreases in a direction from the first edge to a position away from a center of the piezoelectric material layer; and the second direction intersects with the first direction. In the fingerprint identification module, because the auxiliary structure is in contact with the first edge of the piezoelectric material layer and includes the slope portion, problems such as disconnection and conductive material residue can be avoided in the process of forming the plurality of first driving electrodes on the piezoelectric material layer, thereby improving the yield of products.

The fingerprint identification module, the manufacturing method of the fingerprint identification module and the electronic device provided by the embodiments of the present disclosure will be described in detail with reference to the accompanying drawings.

Figure 6A:
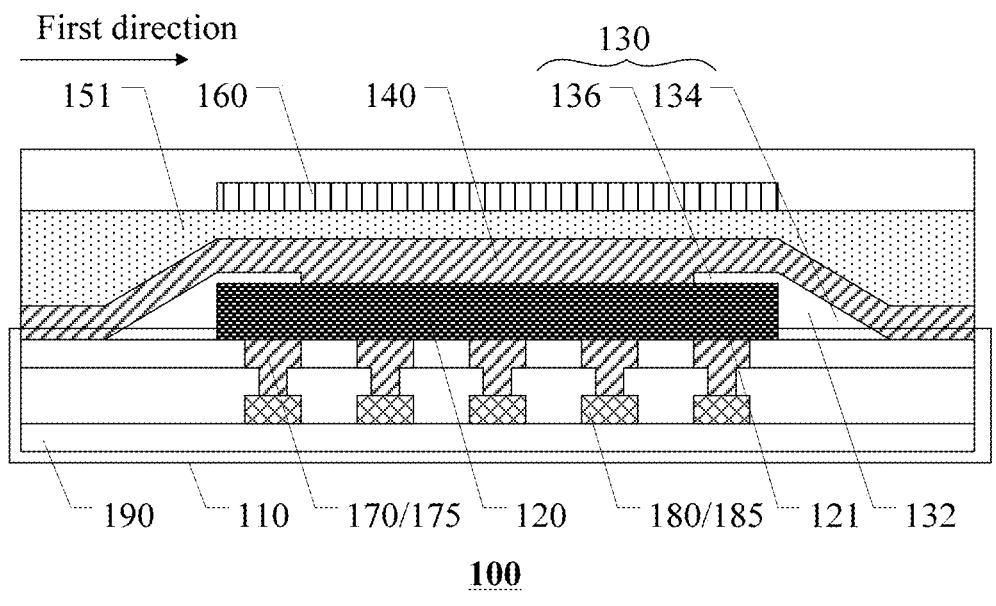
FIG. 6A is a schematic cross-sectional view along a first direction of the fingerprint identification module according to an embodiment of the present disclosure.
Figure 6B:
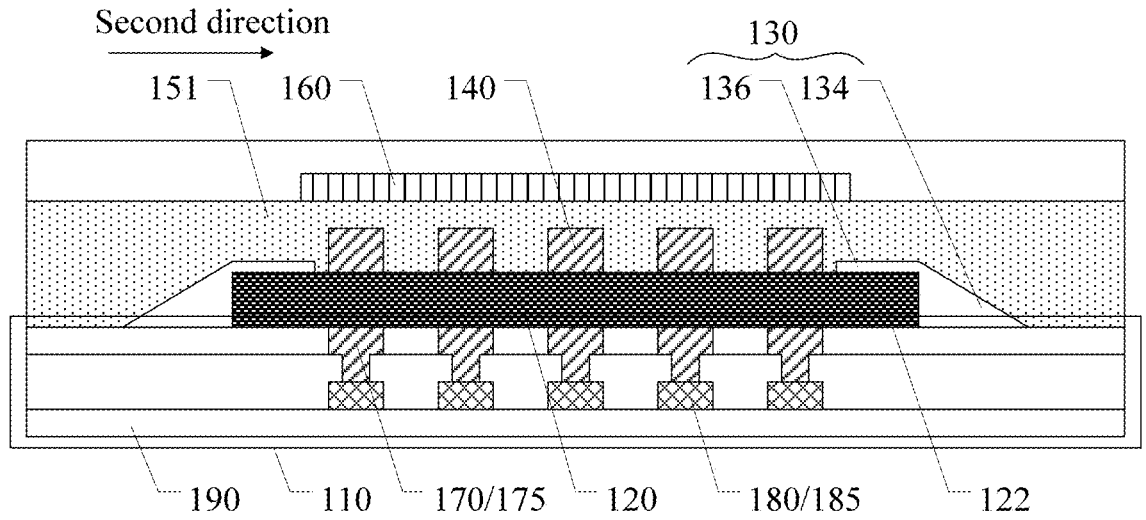
FIG. 6B is a schematic cross-sectional view along a second direction of the fingerprint identification module according to an embodiment of the present disclosure.

An embodiment of the present disclosure provides a fingerprint identification module. FIG. 6A is a schematic cross-sectional view along the first direction of the fingerprint identification module according to an embodiment of the present disclosure; FIG. 6B is a schematic cross-sectional view along the second direction of the fingerprint identification module according to an embodiment of the present disclosure. As shown in FIGS. 6A and 6B, the fingerprint identification module 100 includes the functional substrate 110, the piezoelectric material layer 120, the auxiliary structure 130 and the plurality of first driving electrodes 140. The piezoelectric material layer 120 is located on the functional substrate 110, and the auxiliary structure 130 is at least partially located on the functional substrate 110. The plurality of first driving electrodes 140 are located on the side of the piezoelectric material layer 120 and the auxiliary structure 130 away from the functional substrate 110. As shown in FIG. 6A, each first driving electrode 140 extends along the first direction and exceeds the first edge 121 of the piezoelectric material layer 120 in the first direction, that is, each first driving electrode 140 goes beyond the first edge 121 of the piezoelectric material layer 120 in the first direction; as shown in FIG. 6B, the plurality of first driving electrodes 140 are arranged at intervals along the second direction and insulated from each other. As shown in FIG. 6A, the auxiliary structure 130 is at least in contact with the first edge 121, and includes a slope portion 132; in the direction from the first edge 121 to a position away from the center of the piezoelectric material layer 120, a thickness of the slope portion 132 in the direction perpendicular to the functional substrate 110 gradually decreases, and the second direction intersects with the first direction. It should be noted that the first edge of the piezoelectric material layer in the first direction means that an extending direction of the first edge intersects with the first direction, rather than that the extending direction of the first edge is parallel to the first direction.

In the fingerprint identification module provided by the embodiments of the present disclosure, because the auxiliary structure is at least in contact with the first edge, the first driving electrode extending in the first direction and exceeding the first edge extends from the piezoelectric material layer to the auxiliary structure instead of directly extending from the piezoelectric material layer to the functional substrate; in addition, the auxiliary structure includes the slope portion, and the thickness of the slope portion gradually decreases from the first edge to the direction away from the center of the piezoelectric material layer. Therefore, in the process of forming the plurality of first driving electrodes on the piezoelectric material layer, the photoresist can be fully exposed and developed at the first edge, so that the problem of disconnection of the conductive layer in the subsequent etching process can be effectively avoided, and the problem of residual conductive material can also be avoided, so that adjacent two first driving electrodes are prevented from being electrically connected, and the yield of products can be improved.

In some examples, the first direction and the second direction are perpendicular to each other. In some examples, as shown in FIGS. 6A and 6B, a slope angle θ of the slope portion 132 is less than 60 degrees. With this arrangement, problems such as disconnection and conductive material residue in the process of forming the plurality of first driving electrodes can be better avoided.

In some examples, as shown in FIGS. 6A and 6B, the auxiliary structure 130 includes a main body portion 134 and an overlapping portion 136; the main body portion 134 is located on the functional substrate 110, and the main body portion 134 is in the same layer as the piezoelectric material layer 120. The overlapping portion 136 is connected to the main body portion 134 and is located on the side of the first edge 121 of the piezoelectric material layer 120 away from the functional substrate 110. With this arrangement, the auxiliary structure can prevent the piezoelectric material layer from falling off in the manufacturing and using processes by fixing the piezoelectric material layer on the functional substrate through the overlapping portion while avoiding the problems such as disconnection and conductive material residue in the forming process of the first driving electrode.

In some examples, the material of the piezoelectric material layer includes polyvinylidene fluoride (PVDF). Because polyvinylidene fluoride is a fluorine-containing material, its adhesion to the functional substrate (such as a silicon nitride layer) is poor, which leads to the piezoelectric material layer falling off easily. Therefore, by arranging the overlapping portion, the fingerprint identification module can effectively avoid and prevent the piezoelectric material layer from falling off in the manufacturing and using processes. On the other hand, in the process of stripping the photoresist pattern (PR), compositions of a stripping liquid of the photoresist pattern usually include N-methyl formamide (NMF) and diethylene glycol monomethyl ether, and the polyvinylidene fluoride is dissolved in N-methyl formamide and ethers. Therefore, on the one hand, the above auxiliary structure can protect the edge of the piezoelectric material layer in the process of stripping the photoresist pattern (PR), preventing the stripping liquid of the photoresist pattern from corroding the piezoelectric material layer, thereby avoiding the falling off of the piezoelectric material layer; on the other hand, the overlapping portion of the auxiliary structure can fix the piezoelectric material layer on the functional substrate, thereby further preventing the piezoelectric material layer from falling off in the manufacturing and using processes.

For example, as shown in FIGS. 6A and 6B, the main body portion 134 includes the slope portion 132 described above. That is, the slope portion 132 is a part of the main body portion 134.

In some examples, a size of the overlapping portion 136 in the first direction is greater than 200 microns. According to experimental results, in the case that the size of the overlapping portion in the first direction is larger than 200 microns, the auxiliary structure can effectively prevent the piezoelectric material layer from falling off in the manufacturing and using processes. For example, the size of the overlapping portion in the first direction may be 400, 600, 800, 1000 or 1500 microns.

In some examples, the material of the auxiliary structure includes curing adhesive. Therefore, in the process of forming the auxiliary structure, after coating the curing adhesive and before curing the auxiliary structure, the curing adhesive undergoes a leveling process due to its certain fluidity or ductility, thus naturally forming the above-mentioned slope portion, thus eliminating the need for an additional process step, thus reducing the manufacturing difficulty and cost. For example, in the case that the curing adhesive is used for the auxiliary structure, the slope angle of the formed slope portion is about 45 degrees.

In some examples, the material of the auxiliary structure includes an optical curing adhesive (OC adhesive). Therefore, the auxiliary structure can be directly patterned by an exposure process without using a mask process, thereby further reducing the manufacturing cost. For example, the material of the auxiliary structure may be an acrylate system material.

In some examples, as shown in FIGS. 6A and 6B, the fingerprint identification module 100 further includes a first insulating layer 151 and an acoustic wave reflective layer 160; the first insulating layer 151 is located on one side of the plurality of first driving electrodes 140 away from the functional substrate 110. The acoustic wave reflective layer 160 is located on one side of the first insulating layer 151 away from the plurality of first driving electrodes 140, and an orthographic projection of the acoustic wave reflective layer 160 on the functional substrate 110 is overlapped with an orthographic projection of the piezoelectric material layer 120 on the functional substrate 110. With this arrangement, the acoustic wave reflective layer 160 can reflect the ultrasonic wave which is generated by the piezoelectric material layer 120 and which propagates to the acoustic wave reflective layer 160 to a position where the functional substrate 110 is located, thereby being beneficial to enhancing the intensity or energy of the transmitted ultrasonic wave.

For example, the acoustic wave reflective layer 160 may be made of silver (Ag), and the first insulating layer 151 may be made of silicon nitride (SiNx). Of course, the embodiments of the present disclosure include but are not limited to this. The acoustic wave reflective layer can also be made of other materials with the characteristic of reflecting the ultrasonic wave, and the first insulating layer can also be made of other insulating materials such as resin.

In some examples, as shown in FIGS. 6A and 6B, the functional substrate 110 includes a receiving electrode layer 170, a driving circuit layer 180 and a substrate 190; the receiving electrode layer 170 is located on one side of the piezoelectric material layer 120 close to the substrate 190 and includes a plurality of receiving electrodes 175. The driving circuit layer 180 is located on one side of the receiving electrode layer 170 close to the substrate 190 and includes a plurality of driving units 185, the plurality of receiving electrodes 175 are arranged in one-to-one correspondence with the plurality of driving units 185 and the plurality of driving units 185 are configured to drive the plurality of receiving electrodes 175 to receive electrical signals generated by the piezoelectric material layer 120. Orthographic projections of the plurality of receiving electrodes 175 on the substrate 190 at least partially overlap with the orthographic projection of the piezoelectric material layer 120 on the substrate 110; the orthographic projections of the plurality of receiving electrodes 175 on the substrate 190 at least partially overlap with the orthographic projections of the plurality of first driving electrodes 140 on the substrate 190, so that a plurality of ultrasonic receiving elements can be formed by the plurality of receiving electrodes 175, the first driving electrodes 140 and the piezoelectric material layer 120.

For example, as shown in FIGS. 6A and 6B, an insulating layer is provided between the plurality of receiving electrodes 175 to ensure that the plurality of receiving electrodes 175 are mutual insulated from each other; similarly, an insulating layer is provided between the plurality of driving units 185 so that the plurality of driving units 185 are insulated from each other.

In the fingerprint identification module provided in this embodiment, the plurality of first driving electrodes arranged on the piezoelectric material layer, the piezoelectric material layer and the plurality of receiving electrodes may constitute a plurality of ultrasonic transmitting elements; the plurality of receiving electrodes, the piezoelectric material layer and the plurality of first driving electrodes may constitute a plurality of ultrasonic receiving elements. In the case that the fingerprint identification module is used for fingerprint identification, the plurality of receiving electrodes can be grounded, and then an alternating voltage is respectively applied to the plurality of first driving electrodes, and portions of the piezoelectric material layer which are respectively corresponding to the first driving electrodes are deformed or drive the films above and below the piezoelectric material layer to vibrate together due to the inverse piezoelectric effect, so that the ultrasonic wave can be generated and transmitted outwards. A first driving electrode layer of the fingerprint identification module includes the plurality of first driving electrodes, and the plurality of ultrasonic transmitting elements can be formed, so that ultrasonic focusing can be realized by respectively driving the plurality of first driving electrodes. On one hand, the intensity or energy of the transmitted ultrasonic wave in a specific region or a specific direction can be improved, thereby improving the fingerprint identification performance; on the other hand, the transmitted ultrasonic wave has better directionality, thereby reducing the crosstalk between valleys and ridges of the fingerprint, and further improving the fingerprint identification performance. In the case that the transmitted ultrasonic wave is reflected back to the fingerprint identification module by the fingerprint, the plurality of ultrasonic receiving elements corresponding to the plurality of receiving electrodes can receive the reflected ultrasonic wave and convert a signal of the ultrasonic wave into electrical signals, thereby realizing fingerprint identification. In addition, in the case that the fingerprint identification module improves the intensity or energy of the transmitted ultrasonic wave in a specific region or a specific direction by focusing the ultrasonic wave, the fingerprint identification module can not only realize fingerprint identification, but also can penetrate a finger to distinguish whether the fingerprint is real skin or not.

In some examples, as shown in FIGS. 6A and 6B, the receiving electrode 175 may be in contact with the piezoelectric material layer 120 so as to better receive the electrical signals. Of course, embodiments of the present disclosure include but are not limited to this.

Figure 6C:
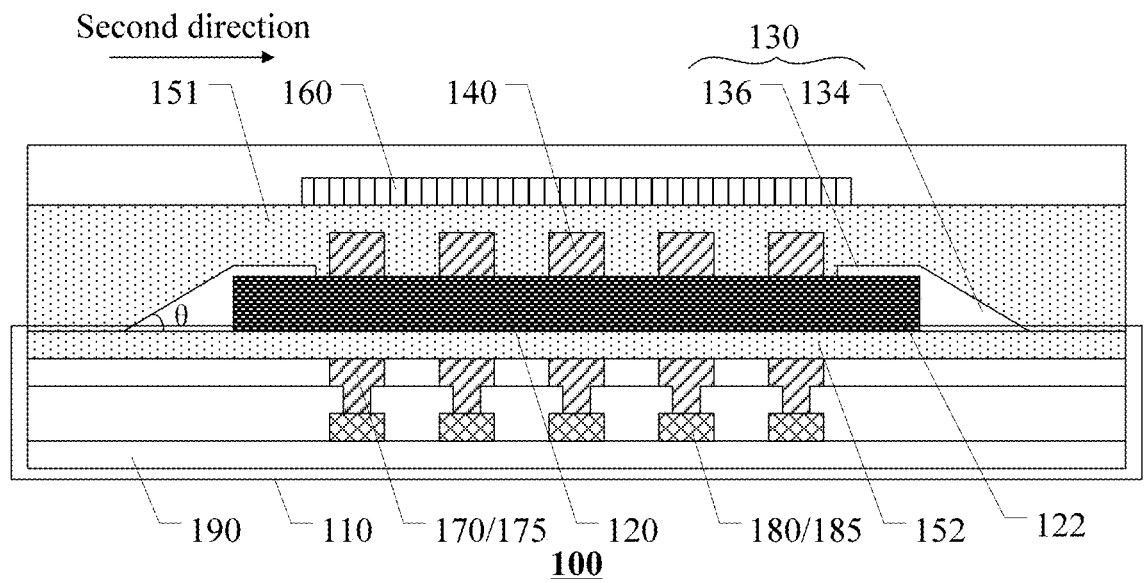
FIG. 6C is another schematic cross-sectional view along the second direction of the fingerprint identification module provided according to an embodiment of the present disclosure.

FIG. 6C is another schematic cross-sectional view along the second direction of the fingerprint identification module provided according to an embodiment of the present disclosure. As shown in FIG. 6C, the functional substrate 110 further includes a second insulating layer 152 located between the receiving electrode layer 170 and the piezoelectric material layer 120. The second insulating layer 152 can reduce the influence that the leakage current generated by the piezoelectric material layer 120 during polarization has on the thin film transistor in the driving unit 185 connected to the receiving electrode 175. For example, the second insulating layer can also be made of silicon nitride (SiNx).

In some examples, the substrate 190 includes a glass substrate.

In some examples, the substrate 190 includes a polyimide substrate. Therefore, the substrate 190 can be made thinner, and the thickness of the substrate 190 ranges from 5 to 20 microns. It should be noted that in the case that the substrate 190 is a polyimide substrate, a polyimide layer can be formed on the glass substrate first, then layer structures such as the receiving electrode layer, the piezoelectric material layer and the first driving electrode layer can be formed on the polyimide layer, and finally the glass substrate is removed, thus obtaining the fingerprint identification module described in this example.

Figure 7:
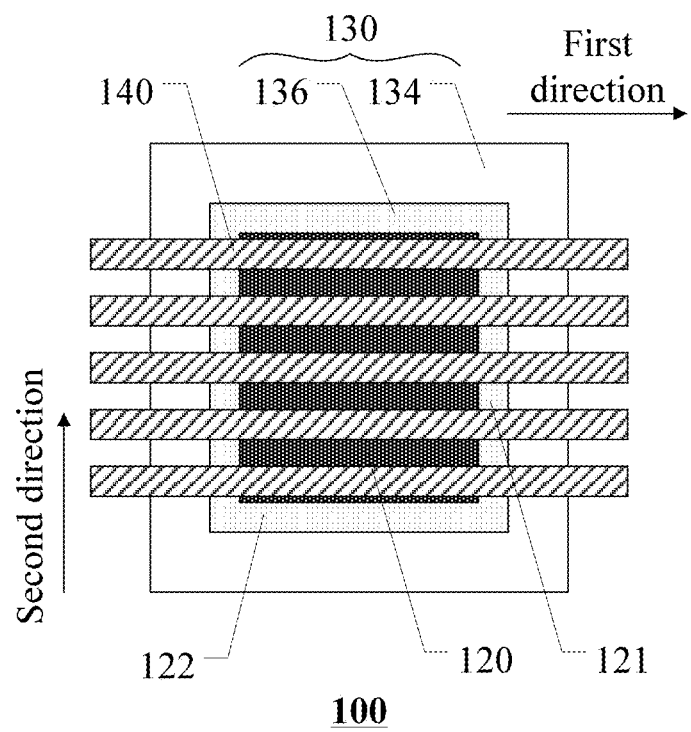
FIG. 7 is a schematic plan view of the fingerprint identification module according to an embodiment of the present disclosure.

FIG. 7 is a schematic plan view of the fingerprint identification module according to an embodiment of the present disclosure. As shown in FIG. 7, the auxiliary structure 130 is arranged along the edge of the piezoelectric material layer 120, and the auxiliary structure 130 is also in contact with a second edge 122 of the piezoelectric material layer 120 in the second direction. With this arrangement, the auxiliary structure can protect the edges of the piezoelectric material layer in all directions in the process of stripping off the photoresist pattern (PR), so as to better prevent the stripping liquid of the photoresist pattern from corroding the piezoelectric material layer, thereby better avoiding the falling off of the piezoelectric material layer. Of course, the embodiments of the present disclosure include but are not limited to this, and the auxiliary structure may also be provided only at the first edge of the piezoelectric material layer along the first direction. It should be noted that the second edge of the piezoelectric material layer in the second direction means that an extending direction of the second edge intersects with the second direction, rather than that the extending direction of the second edge is parallel to the second direction.

For example, as shown in FIG. 7, the shape of the orthographic projection of the piezoelectric material layer 120 on the functional substrate 110 may include a rectangle, such as a square. The auxiliary structure 130 is disposed along four edges of the piezoelectric material layer 120. Of course, the embodiments of this disclosure include but are not limited to this, and the shape of the piezoelectric material layer can be set according to actual needs; the auxiliary structure may also be provided only at the first edge of the piezoelectric material layer in the first direction.

Figure 8:
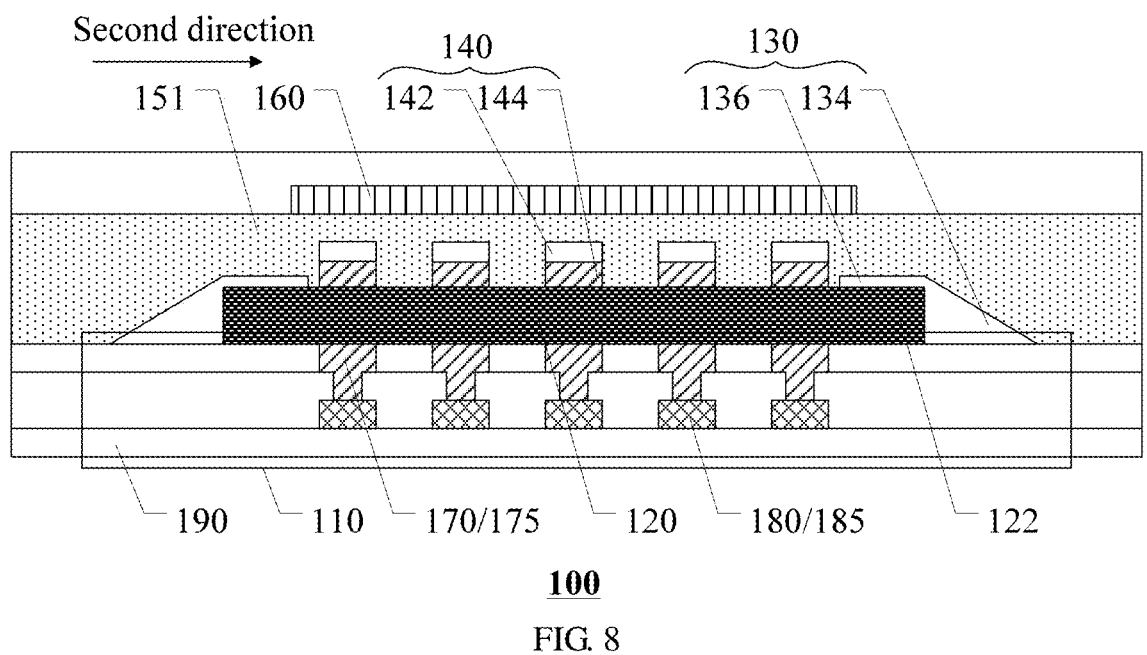
FIG. 8 is another schematic structural diagram of the fingerprint identification module provided according to an embodiment of the present disclosure.

FIG. 8 is another schematic structural diagram of the fingerprint identification module provided according to an embodiment of the present disclosure. As shown in FIG. 8, each of the first driving electrodes 140 includes a metal layer 142 and a transparent metal oxide layer 144 which are sequentially stacked in the direction perpendicular to the functional substrate. The compositions of the stripping liquid of the photoresist pattern usually include N-methyl formamide (NMF) and diethylene glycol monomethyl ether, and polyvinylidene fluoride is dissolved in N-methyl formamide and ethers. Therefore, the transparent metal oxide layer can be used as a mask in the process of forming the first driving electrodes, thereby preventing the stripping liquid of the photoresist pattern from corroding the piezoelectric material layer. It should be noted that the common etching solution of the transparent metal oxide layer cannot etch the metal layer, and the etching solution of the metal layer cannot etch the transparent metal oxide layer, so the transparent metal oxide layer can be used as a mask to etch the metal layer.

Next, this will be explained through the specific manufacturing process of the first driving electrodes. For example, forming the plurality of first driving electrodes on the side of the piezoelectric material layer and the auxiliary structure away from the functional substrate includes the following steps: forming the metal layer on the side of the piezoelectric material layer and the auxiliary structure away from the functional substrate; forming the transparent metal oxide layer on the side of the metal layer away from the piezoelectric material layer; forming the photoresist pattern on the side of the transparent metal oxide layer away from the metal layer, and patterning the transparent metal oxide layer with the photoresist pattern as a mask to form the plurality of strip-shaped transparent metal oxides; stripping the photoresist pattern; and forming the plurality of first driving electrodes by etching the metal layer with the plurality of strip-shaped transparent metal oxides as a mask. It can be seen that in the above manufacturing process, in stripping the photoresist pattern, the metal layer still covers the piezoelectric material layer, and thus can avoid the contact between the stripping liquid and the piezoelectric material layer. Therefore, the stripping liquid of the photoresist pattern can be prevented from corroding the piezoelectric material layer.

For example, the transparent metal oxide may include indium tin oxide (ITO). Of course, the embodiments of the present disclosure include but are not limited to this, and the above-mentioned transparent metal oxide can also be other specific materials.

In some examples, the thickness of the transparent metal oxide layer ranges from 700 to 1350 Å. Because the piezoelectric material layer is usually a porous material with rough surface, leading to a phenomenon that a surface of the metal layer is uneven, in this way, the transparent metal oxide layer can better cover the metal layer.

Figure 9:
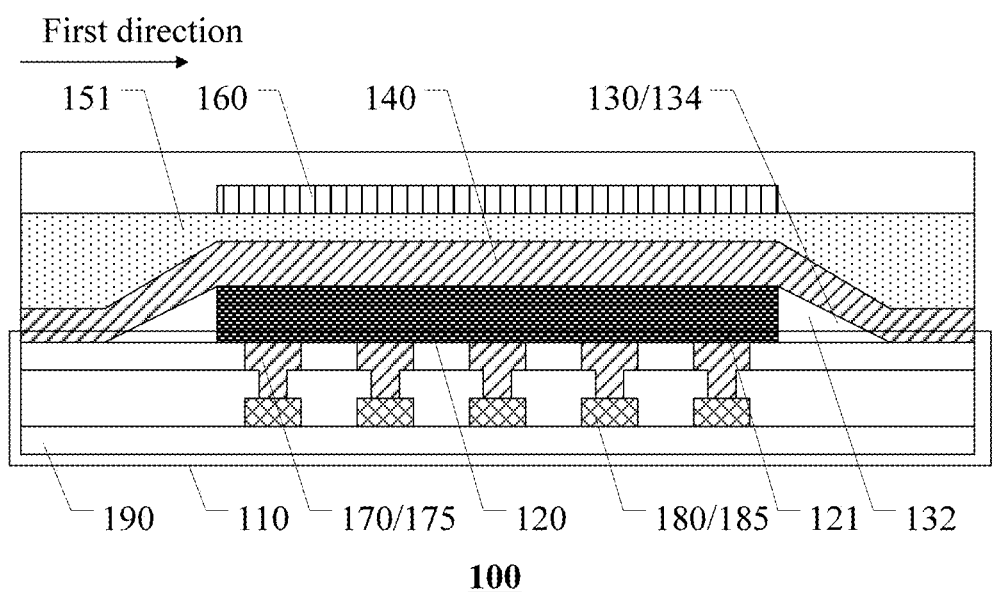
FIG. 9 is still another schematic structural diagram of the fingerprint identification module provided according to an embodiment of the present disclosure.

FIG. 9 is another schematic structural diagram of the fingerprint identification module provided according to an embodiment of the present disclosure. As shown in FIG. 9, the fingerprint identification module 100 includes the functional substrate 110, the piezoelectric material layer 120, the auxiliary structure 130 and the plurality of first driving electrodes 140. The piezoelectric material layer 120 is located on the functional substrate 110, and the auxiliary structure 130 is at least partially located on the functional substrate 110. The plurality of first driving electrodes 140 are located on the side of the piezoelectric material layer 120 and the auxiliary structure 130 away from the functional substrate 110. Each first driving electrode 140 extends along the first direction and exceeds the first edge 121 of the piezoelectric material layer 120 in the first direction. The plurality of first driving electrodes 140 are arranged at intervals along the second direction, and the plurality of first driving electrodes 140 are insulated from each other. The auxiliary structure 130 is in contact with the first edge 121 and includes the slope portion 132; in the direction from the first edge 121 to a position away from the center of the piezoelectric material layer 120, the thickness of the slope portion 132 in the direction perpendicular to the functional substrate 110 gradually decreases. As shown in FIG. 9, the auxiliary structure 130 only includes the main body portion 134 located on the functional substrate 110 and disposed in the same layer as the piezoelectric material layer 120, and does not include the overlapping portion 136. With this arrangement, the auxiliary structure can effectively avoid the problem of disconnection of the conductive layer in the subsequent etching process, and can also avoid the problem of residual conductive material, thereby avoiding the electrical connection between two adjacent first driving electrodes and improving the yield of products. In addition, although there is no overlapping portion, the auxiliary structure can protect the edge of the piezoelectric material layer in the process of stripping the photoresist pattern (PR), thus preventing the piezoelectric material layer from falling off.

Figure 10A:
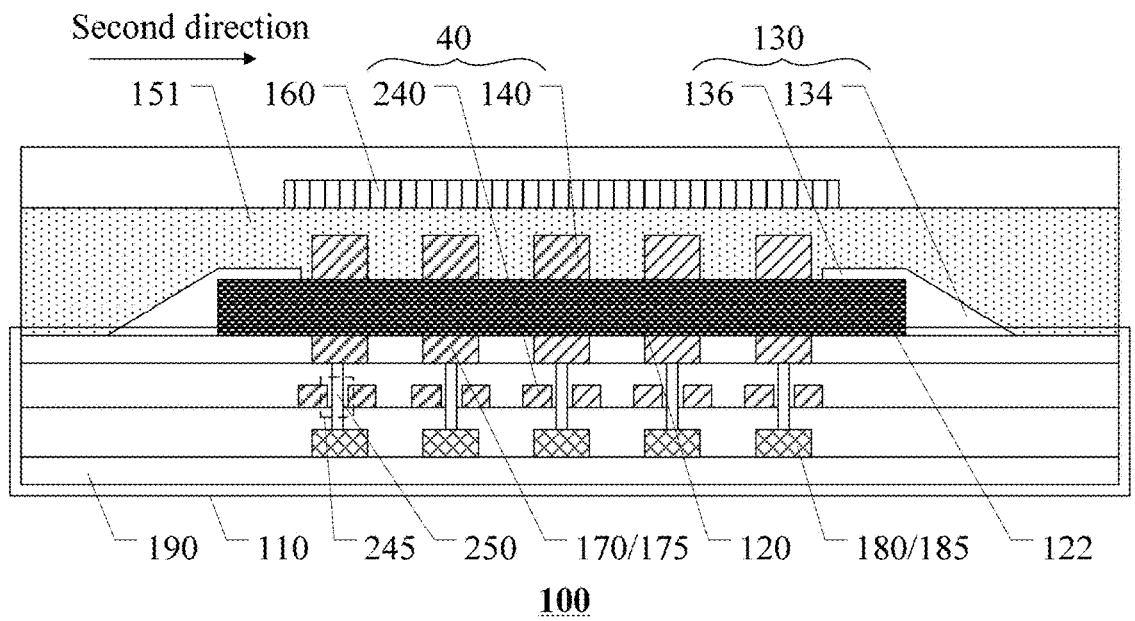
FIG. 10A is another schematic cross-sectional view along the second direction of the fingerprint identification module provided according to an embodiment of the present disclosure.
Figure 10B:
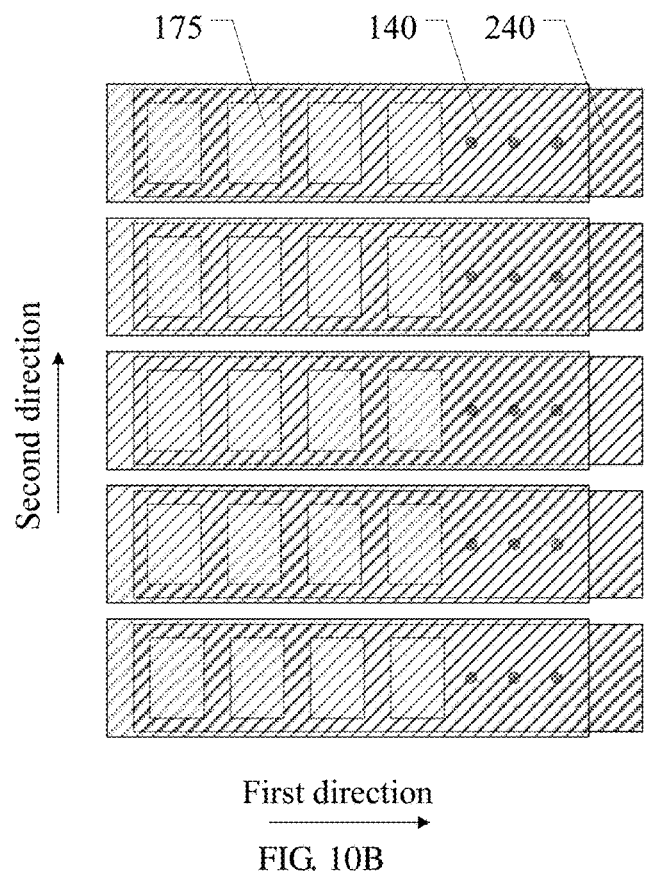
FIG. 10B is a schematic diagram of the positional relationship between driving electrodes and receiving electrodes in another fingerprint identification module according to an embodiment of the present disclosure.

An embodiment of the present disclosure provides a fingerprint identification module. FIG. 10A is another schematic cross-sectional view along the second direction of the fingerprint identification module provided according to an embodiment of the present disclosure; FIG. 10B is another schematic diagram of the positional relationship between the driving electrodes and the receiving electrodes in the fingerprint identification module according to an embodiment of the present disclosure. As shown in FIG. 10A, the fingerprint identification module 100 includes the functional substrate 110, the piezoelectric material layer 120, the auxiliary structure 130 and the plurality of first driving electrodes 140. The piezoelectric material layer 120 is located on the functional substrate 110, and the auxiliary structure 130 is at least partially located on the functional substrate 110. The plurality of first driving electrodes 140 are located on the side of the piezoelectric material layer 120 and the auxiliary structure 130 away from the functional substrate 110. The functional substrate 110 includes a substrate receiving electrode layer 170, a driving circuit layer 180 and a substrate 190; the receiving electrode layer 170 is located on a side of the piezoelectric material layer 120 close to the substrate 190 and includes the plurality of receiving electrodes 175. The driving circuit layer 180 is located on a side of the receiving electrode layer 170 close to the substrate 190 and includes the plurality of driving units 185, the plurality of driving units 185 are arranged in one-to-one correspondence with the plurality of driving units 185, and the plurality of driving units 185 are configured to drive the plurality of receiving electrodes 175 to receive the electrical signals generated by the piezoelectric material layer 120. The orthographic projections of the plurality of receiving electrodes 175 on the substrate 190 at least partially overlap with the orthographic projection of the piezoelectric material layer 120 on the substrate 110.

As shown in FIGS. 10A and 10B, the functional substrate 110 further includes a plurality of second driving electrodes 240 located between the receiving electrode layer 170 and the driving circuit layer 180. The plurality of first driving electrodes 140 and the plurality of second driving electrodes 240 form a plurality of driving electrode pairs 40, and orthographic projections of the first driving electrode 140 and the second driving electrode 240 which are in each driving electrode pair 40 on the piezoelectric material layer 120 at least partially overlap. With this arrangement, the first driving electrode and the second driving electrode which are in each driving electrode pair and the piezoelectric material layer can constitute one ultrasonic wave emitting element, thereby realizing ultrasonic wave emission. In addition, the fingerprint identification module can also apply a first driving voltage (for example, +50V) to the first driving electrode and apply a second driving voltage (for example, −50V) having a polarity that is opposite to that of the first driving voltage to the second driving electrode, thereby realizing high-voltage driving or high-voltage excitation of the piezoelectric material layer with lower driving voltage (absolute value). Therefore, the fingerprint identification module can realize high-voltage driving or high-voltage excitation of the piezoelectric material layer with a lower driving voltage (absolute value), which can greatly reduce the risk of breakdown of electronic components (such as thin film transistors) in the driving unit caused by high voltage, thereby improving the stability and durability of products, and which is beneficial to realize a large-sized fingerprint identification module on the other hand. It should be noted that because the receiving electrode is electrically connected with the driving unit, and the driving voltage cannot be directly applied to the receiving electrode, the fingerprint identification module provided in this example skillfully sets the plurality of second driving electrodes which form the plurality of driving electrode pairs with the plurality of first driving electrodes to realize high-voltage driving or high-voltage excitation of the piezoelectric material layer with a lower driving voltage (absolute value).

In some examples, as shown in FIG. 10B, the plurality of receiving electrodes 175 are arranged in an array along the first and second directions, the plurality of first driving electrodes 140 are arranged along the second direction, the plurality of second driving electrodes 140 are arranged along the second direction, and each first driving electrode 140 and each second driving electrode 240 are strip electrodes extending along the first direction.

In some examples, as shown in FIGS. 10A and 10B, an orthographic projection of each second driving electrode 240 on the piezoelectric material layer 120 at least partially is overlapped with the orthographic projections of several receiving electrodes 175 arranged in the first direction on the piezoelectric material layer 120. The fingerprint identification module 100 further includes a plurality of connecting electrodes 250, each second driving electrode 240 includes a plurality of through holes 245, and the plurality of connecting electrodes 250 are respectively arranged in the plurality of through holes 245 and electrically connect the plurality of receiving electrodes 175 with the plurality of driving units 185 respectively. With this arrangement, the receiving electrodes can better receive the electrical signals generated by the piezoelectric material layer due to receiving the ultrasonic wave, thereby improving the accuracy of fingerprint recognition.

Figure 11:
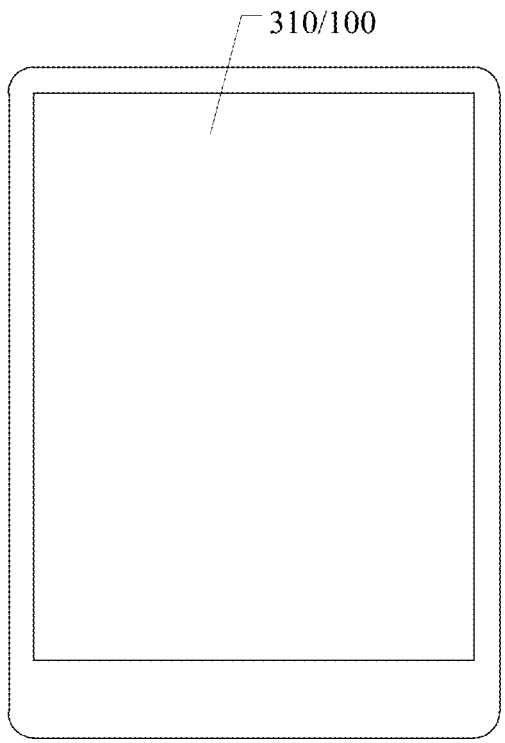
FIG. 11 is a structural diagram of an electronic device provided according to an embodiment of the present disclosure.

An embodiment of the present disclosure also provides an electronic device. FIG. 11 is a structural diagram of the electronic device according to an embodiment of the present disclosure. As shown in FIG. 11, the electronic device 300 includes the fingerprint identification module 100 described above. Therefore, the electronic device can realize the fingerprint identification function. In addition, because the fingerprint identification module included in the electronic device can effectively avoid the problems of disconnection of the conductive layer and residual conductive material in the subsequent etching process, the electronic device has better yield and performance.

For example, in some examples, as shown in FIG. 11, the display device 300 further includes a display module 310, and the area of the display module 310 is substantially the same as the area of the fingerprint identification module 100, so that full-screen fingerprint recognition can be realized. At this time, the fingerprint identification module can also realize a touch function, so that an additional touch device, such as a capacitive touch panel, is not required, and the cost of the display device can be reduced. Of course, the embodiments of this disclosure include but are not limited to this.

The area of the display module and the area of the fingerprint identification module may be not equal, and the fingerprint identification module may be arranged only in the area where fingerprint identification is required.

In some examples, the electronic device may be a display device. For example, the display device can be an electronic apparatus with display function such as a television, a mobile phone, a computer, a notebook computer, an electronic photo album, and a navigator.

Figure 12:
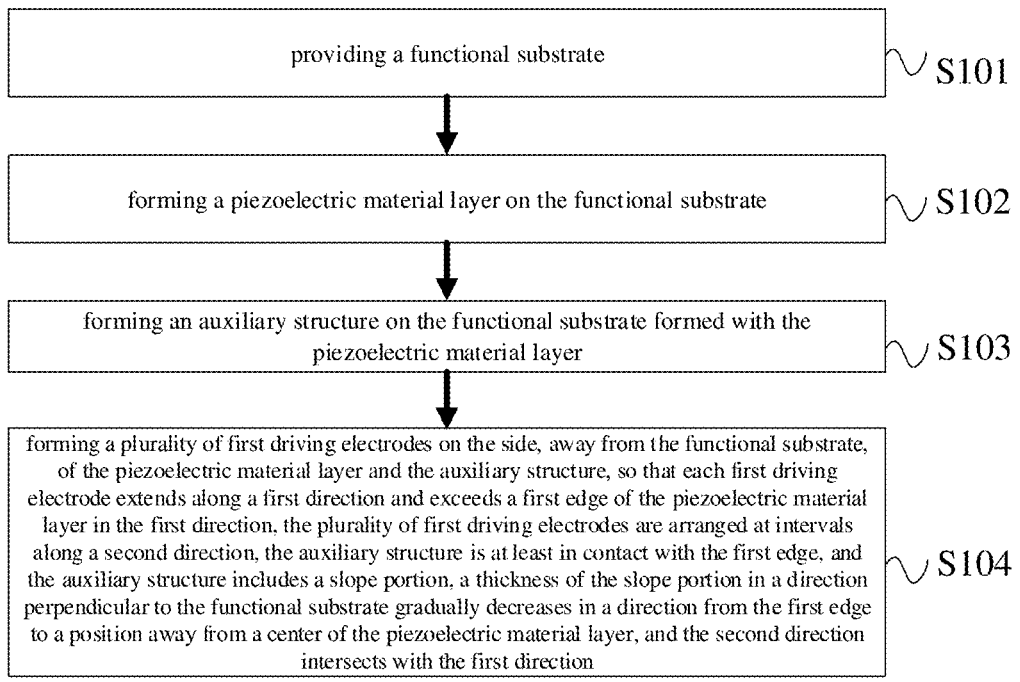
FIG. 12 is a flowchart of a manufacturing method of the fingerprint identification module according to an embodiment of the present disclosure.

An embodiment of the present disclosure also provides a manufacturing method of the fingerprint identification module. FIG. 12 is a flowchart of the manufacturing method of the fingerprint identification module according to an embodiment of the present disclosure. As shown in FIG. 12, the manufacturing method of the fingerprint identification module includes the following steps S101-S104.

Step S101: providing the functional substrate.

Step S102: forming the piezoelectric material layer on the functional substrate. For example, the piezoelectric material layer can be made of a piezoelectric material with high piezoelectric voltage constant, such as polyvinylidene fluoride (PVDF).

Step S103: forming the auxiliary structure on the functional substrate formed with the piezoelectric material layer.

Step S104: forming the plurality of first driving electrodes on the side, away from the functional substrate, of the piezoelectric material layer and the auxiliary structure, so that each first driving electrode extends along the first direction and exceeds the first edge of the piezoelectric material layer in the first direction, the plurality of first driving electrodes are arranged at intervals along the second direction, the auxiliary structure is at least in contact with the first edge, and the auxiliary structure includes the slope portion, the thickness of the slope portion in the direction perpendicular to the functional substrate gradually decreases from the first edge to the direction away from the center of the piezoelectric material layer, and the second direction intersects with the first direction.

In the manufacturing method of the fingerprint identification module provided by the embodiments of the disclosure, because the auxiliary structure is at least in contact with the first edge, the first driving electrode extending in the first direction and exceeding the first edge extends from the piezoelectric material layer to the auxiliary structure instead of directly extending from the piezoelectric material layer to the functional substrate; in addition, the auxiliary structure includes the slope portion, and the thickness of the slope portion gradually decreases from the first edge to the direction away from the center of the piezoelectric material layer. Therefore, in the process of forming the plurality of first driving electrodes on the piezoelectric material layer, the photoresist can be fully exposed and developed at the first edge, so that the problem of disconnection of the conductive layer in the subsequent etching process can be effectively avoided, and the problem of residual conductive material can also be avoided, so that the adjacent two first driving electrodes are prevented from being electrically connected, and the yield of products can be improved.

In some examples, forming the auxiliary structure on the functional substrate formed with the piezoelectric material layer includes: coating a liquid curing adhesive on the functional substrate formed with the piezoelectric material layer; patterning the liquid curing adhesive to expose at least part of the piezoelectric material layer; and curing the liquid curing adhesive, so that the slope portion is formed by leveling and curing the liquid curing adhesive. Therefore, in the process of forming the auxiliary structure, the liquid curing adhesive has certain fluidity or ductility, the liquid curing adhesive undergoes a leveling process, so that the above-mentioned slope portion is naturally formed, thus no additional process step is needed, and the manufacturing difficulty and cost can be reduced.

For example, the first direction and the second direction may be perpendicular to each other.

In some examples, the material of the auxiliary structure includes optical curing adhesive (OC adhesive). Therefore, in the step of patterning the liquid curing adhesive to expose at least part of the piezoelectric material layer, the liquid curing adhesive can be directly patterned by the exposure process without using the mask process, thereby further reducing the manufacturing cost. For example, the material of the auxiliary structure may be an acrylate system material.

For example, the liquid curing adhesive can be cured by thermal curing. Of course, the embodiments of this disclosure include but are not limited to this, and other curing methods can be used to cure the liquid curing adhesive.

For example, the material of the auxiliary structure can be a low-temperature curable material; for example, the curing temperature is less than 130 degrees Celsius. With this arrangement, adverse effects of high temperature on other structures of the fingerprint identification module can be avoided.

In some examples, forming the auxiliary structure on the functional substrate formed with the piezoelectric material layer includes: patterning the liquid curing adhesive to expose at least part of the piezoelectric material layer to form the main body portion which is located on the functional substrate and arranged in the same layer as the piezoelectric material layer, and to form the overlapping portion connected with the main body portion and located at a side, away from the functional substrate, of the first edge of the piezoelectric material layer. With this arrangement, the auxiliary structure can prevent the piezoelectric material layer from falling off in the manufacturing and using processes by fixing the piezoelectric material layer on the functional substrate through the overlapping portion while avoiding the generation of the problems such as disconnection and conductive material residue in the forming process of the first driving electrodes.

In some examples, in the case that the material of the piezoelectric material layer includes polyvinylidene fluoride (PVDF), the adhesion between PVDF and the functional substrate (such as silicon nitride layer) is poor, which leads to the piezoelectric material layer falling off easily. Therefore, by forming the overlapping portion, the manufacturing method of the fingerprint identification module can effectively avoid and prevent the piezoelectric material layer from falling off in the manufacturing process. On the other hand, in the process of stripping the photoresist pattern (PR), the compositions of the stripping liquid of the photoresist pattern usually include N-methyl formamide (NMF) and diethylene glycol monomethyl ether, and polyvinylidene fluoride is dissolved in N-methyl formamide and ethers. Therefore, on the one hand, the above auxiliary structure can protect the edge of the piezoelectric material layer in the process of stripping the photoresist pattern (PR), preventing the stripping liquid of the photoresist pattern from corroding the piezoelectric material layer, thereby avoiding the falling off of the piezoelectric material layer; on the other hand, the overlapping portion of the auxiliary structure can fix the piezoelectric material layer on the functional substrate, thereby further preventing the piezoelectric material layer from falling off in the manufacturing process.

In some examples, the size of the overlapping portion in the first direction is greater than 200 microns. According to the experimental results, in the case that the size of the overlapping portion in the first direction is larger than 200 microns, the auxiliary structure can effectively prevent the piezoelectric material layer from falling off in the processes of manufacturing and using. For example, the size of the overlapping portion in the first direction may be 400, 600, 800, 1000 or 1500 microns.

In some examples, forming the plurality of first driving electrodes on the side of the piezoelectric material layer and the auxiliary structure away from the functional substrate includes: forming the metal layer on the side of the piezoelectric material layer and the auxiliary structure away from the functional substrate; forming the transparent metal oxide layer on the side of the metal layer away from the piezoelectric material layer; patterning the transparent metal oxide layer to form the plurality of strip-shaped transparent metal oxides; and etching the metal layer with the plurality of strip-shaped transparent metal oxides as a mask to form the plurality of first driving electrodes. Therefore, in stripping the photoresist pattern, the metal layer still covers the piezoelectric material layer, so that the stripping liquid of the photoresist pattern can be prevented from corroding the piezoelectric material layer.

For example, patterning the transparent metal oxide layer to form the plurality of strip-shaped transparent metal oxides includes: forming the photoresist pattern on the side of the transparent metal oxide layer away from the metal layer; patterning the transparent metal oxide layer with the photoresist pattern as a mask to form the plurality of strip-shaped transparent metal oxides; and stripping the photoresist pattern. It can be seen that in the above manufacturing process, in stripping the photoresist pattern, the metal layer still covers the piezoelectric material layer, so that the stripping liquid of the photoresist pattern can be prevented from corroding the piezoelectric material layer.

For example, the transparent metal oxide may include indium tin oxide (ITO).

In some examples, the thickness of the transparent metal oxide layer ranges from 700 to 1350 Å. Because the piezoelectric material layer is usually a porous material with rough surface, the surface of the metal layer is uneven, in this way, the transparent metal oxide layer can better cover the metal layer.

In some examples, forming the piezoelectric material layer on the functional substrate includes: coating and crystallizing a piezoelectric material on the functional substrate; forming a hard mask on the crystallized piezoelectric material; and etching the crystallized piezoelectric material by using the hard mask as a mask to form the piezoelectric material layer. A material of the hard mask includes at least one selected from the group consisting of molybdenum, aluminum, titanium, niobium and indium tin oxide. Therefore, by using the hard mask, the stripping liquid of photoresist pattern can be prevented from corroding the piezoelectric material layer to a certain extent, so as to improve the quality of the piezoelectric material layer and improve the performance of the fingerprint identification module.

The following points need to be explained:

(1) In the drawings of the embodiments of this disclosure, only the structures related to the embodiments of this disclosure are involved, and other structures can refer to the general design.

(2) Under the condition of no conflict, the features in the same embodiment and features in different embodiments of this disclosure can be combined with each other.

The above is only specific embodiments of this disclosure, but the protection scope of this disclosure is not limited to these. Any person familiar with this technical field can easily think of changes or substitutions within the technical scope disclosed in this disclosure, which should be covered within the protection scope of this disclosure. Therefore, the protection scope of this disclosure shall be subject to the protection scope of the claims.

What is claimed is:

1. A fingerprint identification module, comprising:
a functional substrate;
a piezoelectric material layer on the functional substrate;
an auxiliary structure at least partially located on the functional substrate;
a plurality of first driving electrodes at a side, away from the functional substrate, of the piezoelectric material layer and the auxiliary structure,
wherein each of the first driving electrodes extends along a first direction and exceeds a first edge of the piezoelectric material layer in the first direction; the plurality of first driving electrodes are arranged at intervals along a second direction; the auxiliary structure is at least in contact with the first edge; the auxiliary structure comprises a slope portion; a thickness of the slope portion in a direction perpendicular to the functional substrate gradually decreases in a direction from the first edge to a position away from a center of the piezoelectric material layer; the second direction intersects with the first direction.

2. The fingerprint identification module according to claim 1, wherein a slope angle of the slope portion is less than 60 degrees.

3. The fingerprint identification module according to claim 1, wherein the auxiliary structure comprises:
a main body portion on the functional substrate and in the same layer as the piezoelectric material layer; and
an overlapping portion connected with the main body portion and located at a side, away from the functional substrate, of the first edge of the piezoelectric material layer.

4. The fingerprint identification module according to claim 3, wherein a size of the overlapping portion in the first direction is larger than 200 microns.

5. The fingerprint identification module according to claim 1, wherein a material of the auxiliary structure comprises a curing adhesive.

6. The fingerprint identification module according to claim 1, wherein a material of the auxiliary structure comprises an optical curing adhesive.

7. The fingerprint identification module according to claim 1, wherein a material of the piezoelectric material layer comprises polyvinylidene fluoride.

8. The fingerprint identification module according to claim 1, wherein the auxiliary structure is arranged along an edge of the piezoelectric material layer, and the auxiliary structure is also in contact with a second edge of the piezoelectric material layer in the second direction.

9. The fingerprint identification module according to claim 1, wherein each of the first driving electrodes comprises a metal layer and a transparent metal oxide layer which are sequentially stacked in the direction perpendicular to the functional substrate.

10. The fingerprint identification module according to claim 1, further comprising:
a first insulating layer at a side, away from the functional substrate, of the plurality of first driving electrodes;
an acoustic wave reflective layer at a side, away from the plurality of first driving electrodes, of the first insulating layer,
wherein an orthographic projection of the acoustic wave reflective layer on the functional substrate is overlapped with an orthographic projection of the piezoelectric material layer on the functional substrate.

11. The fingerprint identification module according to claim 1, wherein the functional substrate comprises:
a substrate;
a receiving electrode layer which is at a side, close to the substrate, of the piezoelectric material layer and comprises a plurality of receiving electrodes; and
a driving circuit layer which is at a side, close to the substrate, of the receiving electrode and comprises a plurality of driving units,
wherein orthographic projections of the plurality of receiving electrodes on the substrate are at least partially overlapped with an orthographic projection of the piezoelectric material layer, and the orthographic projections of the plurality of receiving electrodes on the substrate are at least partially overlapped with orthographic projections of the first driving electrodes.

12. The fingerprint identification module according to claim 11, wherein the functional substrate further comprises:
a second insulating layer between the receiving electrode layer and the piezoelectric material layer.

13. The fingerprint identification module according to claim 11, wherein the functional substrate further comprises:
a plurality of second driving electrodes between the receiving electrode layer and the driving circuit layer,
wherein the plurality of first driving electrodes and the plurality of second driving electrodes constitute a plurality of driving electrode pairs, and an orthographic projection of a first driving electrode and an orthographic projection of a second driving electrode which belong to each of the driving electrode pairs on the piezoelectric material layer are at least partially overlapped with each other.

14. An electronic device, comprising the fingerprint identification module according to claim 1.

15. A manufacturing method of a fingerprint identification module, comprising:
providing a functional substrate;
forming a piezoelectric material layer on the functional substrate;
forming an auxiliary structure on the functional substrate on which the piezoelectric material layer is formed; and
forming a plurality of first driving electrodes on a side, away from the functional substrate, of the piezoelectric material layer and the auxiliary structure,
wherein each first driving electrode extends along a first direction and exceeds a first edge of the piezoelectric material layer in the first direction; the plurality of first driving electrodes are arranged at intervals along a second direction; the auxiliary structure is at least in contact with the first edge; the auxiliary structure comprises a slope portion; a thickness of the slope portion in a direction perpendicular to the functional substrate gradually decreases in a direction from the first edge to a position away from a center of the piezoelectric material layer; and the second direction intersects with the first direction.

16. The manufacturing method of the fingerprint identification module according to claim 15, wherein forming the auxiliary structure on the functional substrate on which the piezoelectric material layer is formed comprises:

coating a liquid curing adhesive on the functional substrate on which the piezoelectric material layer is formed;

patterning the liquid curing adhesive to at least expose a part of the piezoelectric material layer; and curing the liquid curing adhesive, wherein the liquid curing adhesive is leveled and cured to form the slope portion.

17. The manufacturing method of the fingerprint identification module according to claim 16, wherein forming the auxiliary structure on the functional substrate on which the piezoelectric material layer is formed comprises:

patterning the liquid curing adhesive to at least expose the part of the piezoelectric material layer to form a main body portion which is on the functional substrate and in the same layer as the piezoelectric material layer, and to form an overlapping portion which is connected with the main body portion and located at a side, away from the functional substrate, of the first edge of the piezoelectric material layer.

18. The manufacturing method of the fingerprint identification module according to claim 17, wherein a size of the overlapping portion in the first direction is larger than 200 microns.

19. The manufacturing method of the fingerprint identification module according to claim 15, wherein forming the plurality of first driving electrodes on the side, away from the functional substrate, of the piezoelectric material layer and the auxiliary structure comprises:

forming a metal layer on the side, away from the functional substrate, of the piezoelectric material layer and the auxiliary structure;

forming a transparent metal oxide layer on a side, away from the piezoelectric material layer, of the metal layer;

patterning the transparent metal oxide layer to form a plurality of strip-shaped transparent metal oxides; and etching the metal layer by using the plurality of strip-shaped transparent metal oxides as a mask to form the plurality of first driving electrodes.

20. The manufacturing method of the fingerprint identification module according to claim 15, wherein forming the piezoelectric material layer on the functional substrate comprises:

coating and crystallizing a piezoelectric material on the functional substrate;

forming a hard mask on the piezoelectric material after crystallization; and etching the piezoelectric material after crystallization by using the hard mask as a mask to form the piezoelectric material layer, wherein a material of the hard mask comprises at least one selected from the group consisting of molybdenum, aluminum, titanium, niobium and indium tin oxide.

* * * * *